United States Patent [19]
Fujimura et al.

[11] Patent Number: 6,107,215
[45] Date of Patent: Aug. 22, 2000

[54] HYDROGEN PLASMA DOWNSTREAM TREATMENT EQUIPMENT AND HYDROGEN PLASMA DOWNSTREAM TREATMENT METHOD

[75] Inventors: Shuzo Fujimura; Hiroki Ogawa, both of Kanagawa; Jun Kikuchi, Tokyo, all of Japan

[73] Assignee: Fujitsu Limited, Kawasaki, Japan

[21] Appl. No.: 09/041,800

[22] Filed: Mar. 13, 1998

[30] Foreign Application Priority Data

May 23, 1997 [JP] Japan ................................ 9-134065

[51] Int. Cl.$^7$ ..................... H01L 21/324; H01L 21/477; H01L 21/26; H01L 21/42
[52] U.S. Cl. ............................................................. 438/798
[58] Field of Search ............................................. 438/798

[56] References Cited

U.S. PATENT DOCUMENTS 5,269,879  12/1993  Rhoades et al. .
5,620,559   4/1997  Kikuchi et al. .
5,919,336   7/1999  Kikuchi et al. .

OTHER PUBLICATIONS

T. Kusuki et al., Abstract No. 255, Electrochem. Soc., pp. 375 and 376, 1993.
H. Nishino et al., 1989 Dry Process Symposium; pp. 90–93.
Jun Kikuchi et al., Jpn. J. Appl. Phys. vol. 33, Part 1, No. 4B, pp. 2207–2211, 1994.

*Primary Examiner*—John F. Niebling
*Assistant Examiner*—J. Jones
*Attorney, Agent, or Firm*—Armstrong, Westerman, Hattori, McLeland & Naughton

[57] ABSTRACT

A hydrogen plasma downstream treatment equipment comprises a first gas supply source for supplying a hydrogen gas, a second gas supply source for supplying a nitrogen fluoride gas, and a tube-like chamber used for surface treatment of a semiconductor layer by use of the hydrogen gas and the nitrogen fluoride gas. The chamber includes a plasma generator for activating the hydrogen gas and the nitrogen fluoride gas by introducing the nitrogen fluoride gas in which a flow rate ratio of the hydrogen gas and the nitrogen fluoride gas is in excess of 4, a processor placed in a downstream of the plasma generator to place the semiconductor layer therein, and gas flow controlling means for controlling the first gas supply source and the second gas supply source so as to set a flow rate of the nitrogen fluoride gas four times a flow rate of the hydrogen gas.

4 Claims, 4 Drawing Sheets

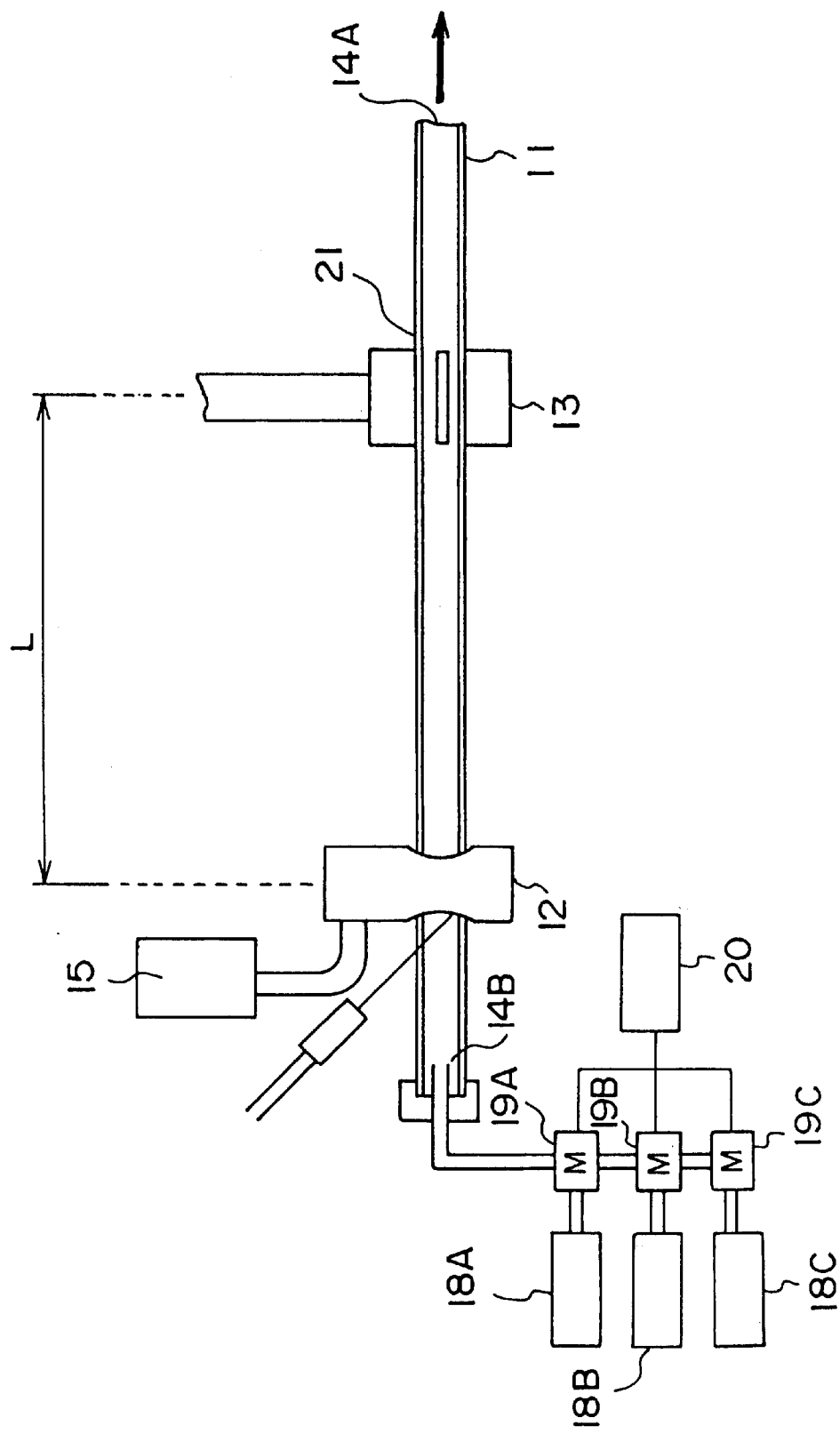

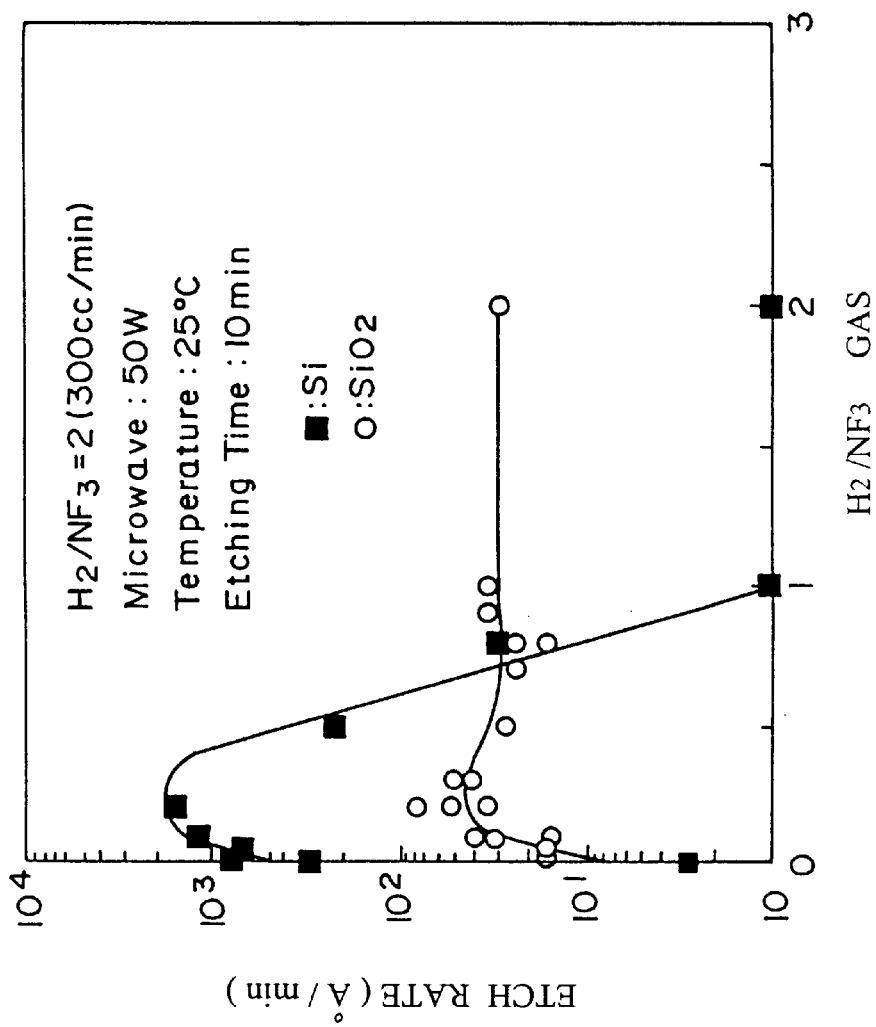

HYDROGEN PLASMA DOWNSTREAM TREATMENT EQUIPMENT AND HYDROGEN PLASMA DOWNSTREAM TREATMENT METHOD

BACKGROUND OF THE INVENTION

1. Field of the Invention

The present invention relates to a hydrogen plasma downstream treatment equipment and a hydrogen plasma downstream treatment method and, more particularly, a so-called dry process for cleaning a surface of a semiconductor layer by placing a semiconductor layer in the downstream of the plasmanized reaction gas region and an equipment for embodying the dry process.

2. Description of the Prior Art

In recent years, influences of a native oxide film formed on a surface of the silicon substrate upon electric characteristics of film quality of an upper film formed on the natural oxide film and electric characteristics at a boundary between respective layers upon growth of metal, silicon, etc. have not been able to be ignored in production of a semiconductor device, in particular, a large scale integrated circuit using a silicon substrate. Therefore, it is needed more and more to remove the native oxide film quickly and at low temperature.

As means for achieving such necessity at best, an $NF_3$-added hydrogen and water-vapor plasma downstream treatment has been known. In such $NF_3$-added hydrogen and water-vapor plasma downstream treatment, the native oxide film formed on the surface of the silicon substrate is removed by means of $NF_3$-added gas which can be obtained by plasmanizing a gas mixture of hydrogen and water-vapor and then adding unplasmanized $NF_3$ in the downstream of such gas flow, so that bonds of atoms on the surface are terminated.

J. Kikuchi, M. Iga, H. Ogawa, S. Fujiwara, and H. Yano, "Native Oxide Removal on Si Surface by $NF_3$-added Hydrogen and Water-vapor Plasma Downstream Treatment", Jpn. J. Appl. Phys., 33, 2207–2211 (1994).

According to this technique, generation of fluorine atoms due to dissociation of $NF_3$ caused by collision between $NF_3$ and high energy particles such as electrons, cations, photons, etc. in the plasma can be avoided by adding $NF_3$ in the downstream of the plasmanized gas mixture of hydrogen and water-vapor. For this reason, there is no fluorine on the surface of the substrate which has been subjected to such treatment, and also there is no possibility that the fluorine atoms etch an inner wall of the vacuum chamber such as quartz to thus produce particles. This technique has been set forth in, for example, an article of J. Kikuchi, M. Nagasaka, S. Fujimura, H. Yano, and Y. Horiike, "Cleaning of Silicon Surface by $NF_3$-added Hydrogen and Water-vapor Plasma Downstream Treatment", Jpn. J. Appl. Phys., 35, 1022–1026 (1996).

Prior to such report about to the treatment which is executed by adding $NF_3$ in the downstream of the plasmanized gas mixture of hydrogen and water-vapor, the $NF_3$+$NH_3$ plasma downflow treatment and the $NF_3$+$H_2$ plasma downflow treatment to execute etching of the silicon oxide film have been reported in an article described in the following, but there has been no difference in advantage between the above $NF_3$-added hydrogen and water-vapor plasma downstream treatment and the $NF_3$+$NH_3$ plasma downflow treatment or the $NF_3$+$H_2$ plasma downflow treatment. Where the "downstream treatment" and the "downflow treatment" have almost the same meaning, as shown in next document. $NF_3$+$NH_3$: H. Nishino, N. Hayasaka, H. Ito, T. Arikado, and H. Okano, Proc. Symp. Dry Process, 1989, Tokyo (The Institute of Electrical Engineers of Japan, Tokyo, 1989) p.90, $NF_3$+$H_2$: T. Kusuki, H. Kawakami, H. Sakaue, and Y. Horiike, Ext. Abstr. Electrochem. Soc., Hawaii (1993), p.375.

The treatment which is executed by adding $NF_3$ in the downstream of the plasmanized gas mixture of hydrogen and water-vapor is rather effective as the native oxide film removing method. However, a region to cause sufficient reaction between $NF_3$ and hydrogen atoms is required so as to produce HF, $NH_3F$, etc. and thus the treatment equipment is increased in size.

The $NF_3$+$NH_3$ plasma downflow treatment and the $NF_3$+$H_2$ plasma downflow treatment have had such an advantage that the treatment equipment is not increased in size, but various problems such that a large quantity of deposits (particles) are produced, fluorine still remain on the surface of the substrate from which the native oxide film is removed, etc. have been reported.

However, both the $NF_3$+$NH_3$ plasma downflow treatment and the $NF_3$+$H_2$ plasma downflow treatment are the plasma downflow treatment in which two kind of gases are mixed simply and therefore implementation of the treatment is relatively simple. In particular, the treatment using $NF_3$+$H_2$ has been commonly employed in mass production steps of the semiconductor device, and are excellent in easy handling together with safety aspect. Therefore, if the problems about to the particles and fluorine can be reduced, the treatment using $NF_3$+$H_2$ is of utility value according to individual applications since the native oxide film can be removed at low cost rather than the treatment which is executed by adding $NF_3$ in the downstream of the plasmanized gas mixture of hydrogen and water-vapor.

SUMMARY OF THE INVENTION

It is an object of the present invention to provide a hydrogen plasma downstream treatment method capable of suppressing problems such as particles, fluorine residue, etc. in $NF_3$+$H_2$ plasma downflow treatment and an equipment for implementing the hydrogen plasma downstream treatment method.

Most of problems that a large quantity of particles are produced in removing the oxide film on the semiconductor layer and fluorine remain on the surface of the substrate are caused by fluorine atoms generated by plasmanizing $NF_3$. For example, it may be considered that particles are due to $(NH_4)_2SiF_6$ which is generated when plasmanized fluorine atoms react with silicon or $NH_3$. In addition, it may be considered that, after the native oxide film is removed, fluorine residue on the surface of the substrate is caused because of adhesion of fluorine atoms.

It is desirable that, if the native oxide film of silicon is etched, HF, $NH_4F$, etc. are synthesized in vapor phase. From this viewpoint, it is desirable that fluorine atoms react with hydrogen atoms or hydrogen molecules to thus become HF. Fluorine atoms generated in plasma react with hydrogen molecules in vapor phase or on the wall surface of the chamber in the course of transportation towards the downstream to thus generate HF. Therefore, the number of collision between the fluorine atoms and the wall surface or other particles relates to attenuation of fluorine atoms. In order to control this attenuation, there is necessity of controlling a distance from plasma to a surface of the workpiece or a pressure.

However, it is not desirable to impose additional constraints upon these parameters since these parameters must also be controlled to obtain unique distribution required for removal of the native oxide film and other constraints are imposed on design conditions of the equipment. Therefore, as the most simple adjusting method, fluorine atoms may be prevented substantially from reaching the surface of the workpiece by examining composition of the reaction gas.

The particles are produced since fluorine atoms react with the inner wall of the chamber such as quartz to produce nonvolatile material such as $SiO_xF_y$, then such material is deposited on the inner wall of the chamber, and then lumps of such material are dropped off to thus stick to the surface of the workpiece.

Accordingly, if the deposits can be removed simply by cleaning before such deposits are collected and then separated from the inner wall of the chamber, influence of the particles can be lessened. Where, since the hydrogen atoms extract fluorine from silicon fluoride, for example, the deposits can be removed before HF is generated and evaporated to result in the particles if the above deposits are changed into $SiO_x$ by reacting hydrogen atoms to extract fluorine. The hydrogen atoms can be supplied by use of hydrogen plasma or water-vapor-added hydrogen plasma.

Because of the described reasons, in the hydrogen plasma downstream treatment equipment and the hydrogen plasma downstream treatment method according to the present invention, the above condition that the flow rate ratio of the hydrogen gas used in the treatment to the nitrogen fluoride gas exceeds 4 is set as the most easily adjustable gas composition condition in place of conventional conditions. Accordingly, the problems such as particles, fluorine residue, etc. can be suppressed to the utmost by causing the hydrogen atoms and the fluorine atoms to react with each other in vapor phase.

BRIEF DESCRIPTION OF THE DRAWINGS

FIG. 1 is a view showing a configuration of a hydrogen plasma downstream treatment equipment according to an embodiment of the present invention;

FIG. 3 is a graph showing a relationship between a ratio of $H_2/NF_3$ and an etching rate when an $SiO_2$ film on a silicon substrate is etched by use of plasma of a gas mixture of $H_2$ and $NF_3$.

DESCRIPTION OF THE PREFERRED EMBODIMENT

Figure 2A:
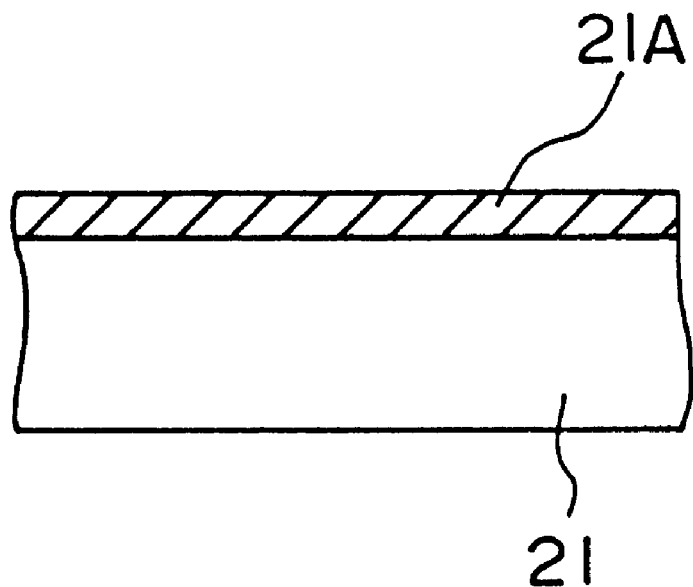
FIGS. 2A and 2B are sectional views illustrating a hydrogen plasma downstream treatment method according to an embodiment of the present invention.

An embodiment of the present invention will be explained in detail with reference to accompanying drawings hereinafter.

FIG. 1 is a schematic view showing a configuration of a hydrogen plasma downstream treatment equipment according to an embodiment of the present invention.

As shown in FIG. 1, the treatment equipment comprises a chamber 11, a plasma generator 12, a processor 13, a microwave generating source 15, a first gas supply source 18A, a first mass flow controller 19A, a second gas supply source 18B, a second mass flow controller 19B, a third gas supply source 18C, a third mass flow controller 19C, and a gas flow controlling means 20.

The chamber 11 is made up of a cylindrical quartz tube having an inner diameter of about 9 mm, and an outer diameter of about 11 mm. The chamber 11 has a gas exhaust port 14A for exhausting gas and a gas introduce port 14B. The plasma generator 12 receives a microwave supplied from the microwave generating source 15 and plasmanizes the gas described later.

The processor 13 is a region used to execute removal of the native oxide film formed on the surface of the semiconductor layer and hydrogen termination treatment, and a silicon substrate (processed material) 21 on which the native oxide film 21A is formed is placed in the processor 13. The processor 13 is provided in the downstream of the gas flow rather than the plasma generator 12 by a distance L.

The microwave generating source 15 generates a microwave of a frequency of 2.45 GHz and supplies the microwave to the plasma generator 12.

The first gas supply source 18A contains a hydrogen ($H_2$) gas therein. The second gas supply source 18B contains a nitrogen fluoride ($NF_3$) gas therein. The third gas supply source 18C generates a water-vapor ($H_2O$).

The first mass flow controller 19A controls a gas flow of the first gas supply source 18A. The second mass flow controller 19B controls a gas flow of the first gas supply source 18B. The third mass flow controller 19C controls a gas flow of the third gas supply source 18C.

The gas flow controlling means 20 is connected to the first to third mass flow controllers 19A to 19C, and controls the first and second mass flow controllers 19A and 19B such that a gas flow rate of the $NF_3$ gas to the $H_2$ gas exceeds 4.

In the above equipment, the chamber 11 is not limited to the quartz tube, and may be formed as a tube-like structure made of silicon oxide.

A hydrogen plasma downstream treatment method using of the above equipment will be explained with reference to FIG. 2 hereunder. FIGS. 2A and 2B are sectional views illustrating a method of removing the native oxide film formed on the surface of the silicon substrate 21 and then executing the hydrogen termination treatment of the surface according to the hydrogen plasma downstream treatment method of the embodiment of the present invention.

Figure 2B:
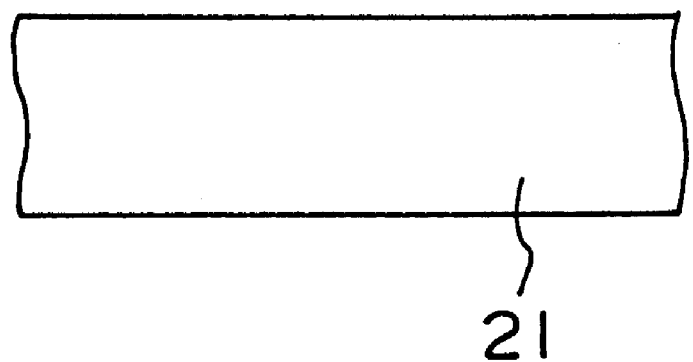

FIG. 2A shows the silicon substrate on which the native oxide film (processed material) 21A is formed. In this case, a substrate temperature is set at a room temperature.

First, the silicon substrate 21 shown in FIG. 2A is loaded on the processor 13 of the treatment equipment shown in FIG. 1. Then, while exhausting the gas in the chamber 11 via the exhaust port 14A, the hydrogen gas is introduced from the gas introduce port 14B into the chamber 11 at a flow rate of 20 cc/min.

Next, the microwave which has a power of about 20 W and a frequency of 2.45 GHz is introduced from the microwave generating source 15 to the plasma generator 12. Hence, the gas can discharge in the plasma generator 12 to generate hydrogen ions, electrons, hydrogen radicals, and fluorines.

At this time, the plasmanized gas locates locally near the plasma generator 12 and active gas which includes a large quantity of hydrogen radicals out of hydrogen ions, electrons, and hydrogen radicals moves along with the gas flow in the downstream of the gas flow.

Subsequently, the $NF_3$ gas is introduced into the chamber 11 at a flow rate of 90 cc/min via the gas introduce port 14B positioned in the downstream of the gas flow from the plasma region so as to be added to the active gas.

It may be considered that some reaction occurs between the active gas and the $NF_3$ gas until they reach the processor 13. If this state is maintained for 15 minutes, the native oxide film 21A formed on the silicon substrate 21 can be removed completely, as shown in FIG. 2B, and hydrogen termination treatment can be executed since hydrogens are coupled with the silicon atoms on the surface of the silicon substrate 21. A thickness of the native oxide film 21A is about 10 to 20 Å.

The presence of the native oxide film 21A can be determined according to whether the surface of the silicon substrate 21 still remains to be hydrophile or it is changed to be hydrophobic. If the surface remains to be hydrophile as it is, the native oxide film 21A still remains. On the contrary, if the surface is changed to be hydrophobic, the native oxide film 21A has been removed and also the hydrogen termination treatment has been done.

In turn, supply of $NF_3$ and $H_2$ into the chamber 11 is terminated in sequence of $NF_3$ and $H_2$, then plasmanization of hydrogen is terminated by stopping application of the microwave, and then introduction of the hydrogen gas is terminated. Then, the silicon substrate 21 is unloaded or carried into an adjacent treatment equipment and then subjected to subsequent steps.

Though the plasma of the gas mixture of $H_2$ gas and $NF_3$ gas has been employed in the present embodiment, the present invention is not limited to such plasma. For example, such plasma may be used that the $NF_3$ gas is introduced and plasmanized and then the water-vapor ($H_2O$) is supplied at a flow rate of 20 cc/min from the third gas supply source 18C via the gas introduce port 14B to be added to hydrogen plasma.

With the above treatment, such an advantage appears that reduction of hydrogen radicals can be suppressed considerably since contents of hydrogen molecules generated by recombination of hydrogen ions or hydrogen radicals can be reduced in the active gas.

In the present embodiment, the gas flow controlling means 20 controls a ratio of a flow rate of $NF_3$ to a flow rate of $H_2$ to exceed 4. According to the above treatment, the problems such as generation of particles, residue of fluorine on the substrate surface, etc. can be reduced. The reason why the flow rate is adjusted in this way will be explained hereunder.

FIG. 3 shows experimental results obtained by the document as shown in T. Kusuki, H. Kawakami, H. Sakaue, and Y. Horiike, Ext. Abstr. Electrochem. Soc., Hawaii (1993), p.375.

According to this experiment, a relationship between a ratio of 3 $H_2/NF_3$ and an etching rate has examined when the $SiO_2$ film formed on the silicon substrate is etched by use of plasma of a gas mixture of $H_2$ and $NF_3$.

In FIG. 3, an abscissa denotes a ratio of $H_2/NF_3$ and an ordinate denotes etching rates of silicon and $SiO_2$.

As shown in FIG. 3, if such ratio of $H_2/NF_3$ is less than 1, an etching rate of $SiO_2$ is about $1\times10$ to $1\times10^2$ Å/min but an etching rate of silicon is also about $1\times10$ to $1\times10^3$ Å/min. This means that not only the active oxide film but also the silicon substrate is etched. This situation is not preferable.

If such ratio of $H_2/NF_3$ is more than 1, an etching rate of silicon becomes 1, so that the silicon substrate is seldom etched. While, an etching rate of $SiO_2$ is still about $1\times10$ to $1\times10^2$ Å/min, so that only the $SiO_2$ film can be etched. This situation is preferable. As a consequence, they have deduced that it is desired that a ratio of hydrogen to fluorine is set to 1. However, it is not clear from this literature that the ratio of $H_2/NF_3$ provided by them denotes which one of a ratio of gas flow and a ratio of partial pressure.

Figure 4:
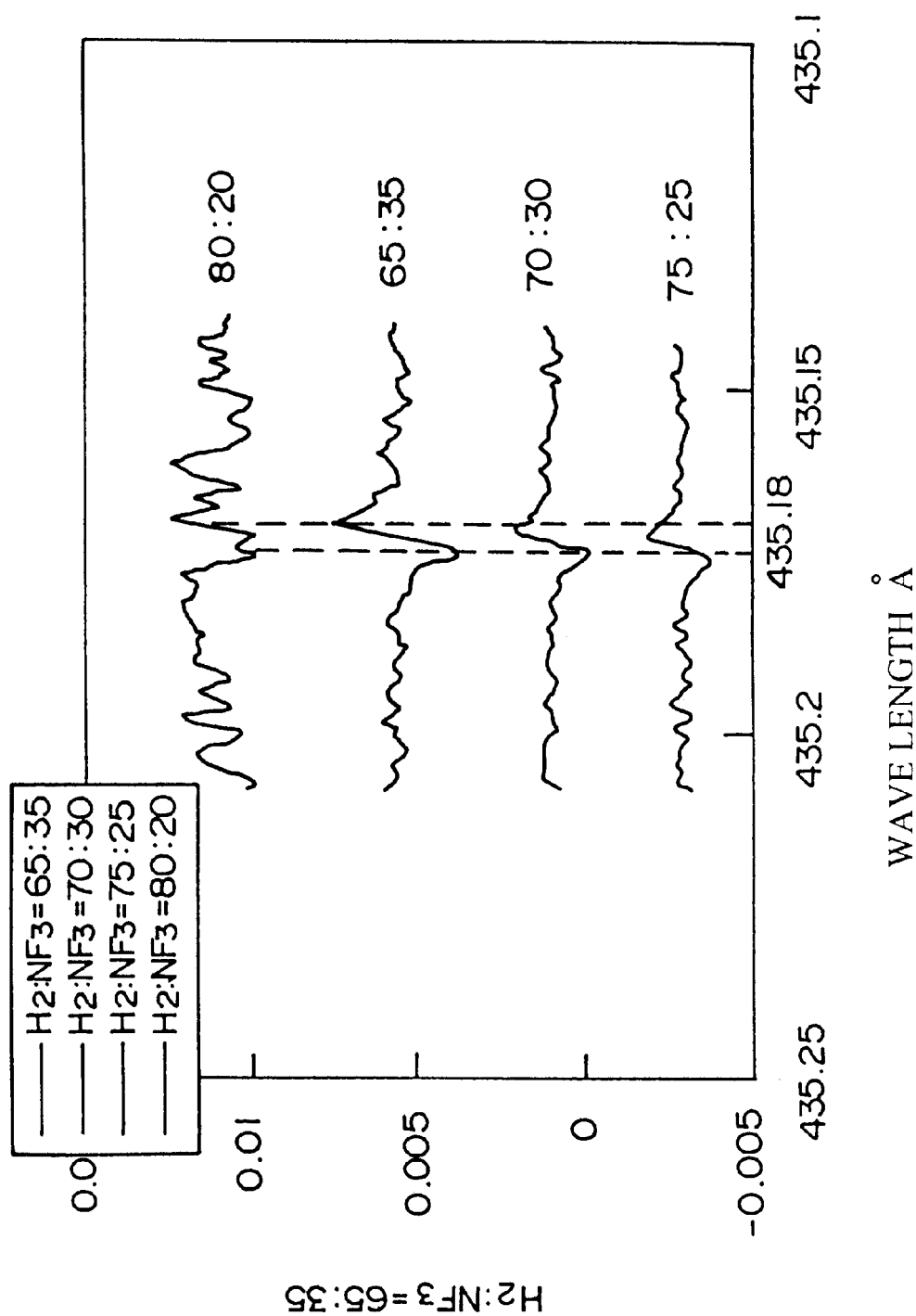
FIG. 4 is a graph showing changing states of an ESR signal when a flow rate of gas mixture of $H_2$ and $NF_3$ is changed.

FIG. 4 shows experimental results obtained by the inventors of the present invention. The treatment equipment shown in FIG. 1 has been used as an experimental equipment.

In this experiment, a gas mixture of hydrogen and nitrogen fluoride is supplied into the chamber 11 by use of the equipment shown in FIG. 1, and microwave plasma is generated by use of an Ebenson type cavity. A concentration of fluorine atoms has been measured by means of electron-spin resonance (ESR) in the downstream by about 30 cm rather than plasma generating location. A change in concentration of fluorine atoms has been measured, while fixing a pressure to 1 Torr and also a flow rate of the gas mixture to 100 cc/min but changing the ratio of hydrogen and nitrogen fluoride. A power of the microwave is set to 30 W. In this equipment, it has been reported in the following literature that, under these conditions (1 Torr, 10 cc/min, 30 W, L=30 cm), influence of high energy particles such as plasma can be substantially disregarded.

J. Kikuchi, S. Fujimura, M. Suzuki, and H. Yano, "Effects of H2O on Atomic Hydrogen Generation in Hydrogen Plasma", Jpn. J. Appl. Phys., 32, 3120–3124 (1993).

J. Kikuchi, M. Iga, H. Ogawa, S. Fujimura, and H. Yano, "Native Oxide Removal on Si Surfaces by $NF_3$-added Hydrogen and Water-vapor Plasma Downstream Treatment", Jpn. J. Appl. Phys., 33, 2207–2211 (1994).

FIG. 4 is a graph wherein an abscissa denotes a wavelength of the ESR signal and an ordinate denotes an intensity of the signal.

In FIG. 4, waveforms of the ESR signal under four conditions ($H_2:NF_3$=80:20, 65:35, 70:30, 75:25) while changing a ratio of a flow rate of $H_2$ to a flow rate of $NF_3$ are shown. In FIG. 4, noise components are seldom superposed on the signal waveforms having the ratio of $H_2:NF_3$=80:20, but they are magnified several times to compare with the ESR signals derived under other conditions.

A large ESR signal has been detected because of fluorine atoms at a flow rate ratio of 1 ($H_2O:NF_3$=1:1). The ESR signal of fluorine atoms is reduced smaller as a flow rate ratio of hydrogen to nitrogen fluoride is increased larger, nevertheless it can be still measured at a hydrogen flow rate of 70 cc/min and a nitrogen fluoride flow rate of 30 cc/min where a partial pressure of hydrogen and nitrogen fluoride becomes about 1.

The ESR signal of fluorine atoms cannot be detected when the hydrogen flow rate becomes 80 cc/min and the nitrogen fluoride flow rate becomes 20 cc/min ($H_2:NF_3$=80:20).

As stated above, the noises have seldom been superposed on the signal waveform and the ESR signal of fluorine atoms have not been detected even when the flow rate ratio of hydrogen is increased much more.

As a consequence, it has been understood that, if the flow rate ratio of hydrogen to nitrogen fluoride exceeds 4, fluorine atoms hardly remain on the surface of the substrate and influence of high energy particles such as plasma can be ignored.

With the above description, it has been found that, if the flow rate ratio of the hydrogen gas to the nitrogen fluoride gas is set more than 4, the problem caused by the influence of fluorine atoms can be suppressed. With the use of this fact, the flow rate ratio of the hydrogen gas to the nitrogen fluoride gas is set more than 4 in the present invention.

Consequently, treatment of the surface of the substrate can be executed while suppressing as much as possible the problems such that fluorines still remain on the surface of the substrate, the inside of the equipment is contaminated by generated particles, etc.

The inventors of the present invention have continued to carry out the experiment. That is, an experiment has been executed in which the native oxide film is removed by placing a strip-like silicon wafer on the ESR measuring location in the above experiment equipment. As a result, the deposited film generated on the surface of the silicon wafer can be reduced smaller as the flow rate ratio of hydrogen to nitrogen fluorine is increased larger. It has been able to be deduced from this result that residual fluorines after the deposited film has been removed by annealing, etc. can also be reduced smaller as the flow rate ratio of the hydrogen gas to the nitrogen fluorine gas is increased larger.

In addition, the native oxide film is removed after the quartz chamber is connected in the downstream of the chamber, then the silicon substrate which is covered with the native oxide film grown by ammonium hydrogen peroxide is loaded therein, then a 1 mm thick capillary plate having a hole of 10 $\mu$m diameter therein is placed on the substrate.

Where the capillary plate is a plate which is used to evaluate approximately a contact hole with a high aspect ratio on the semiconductor device. A plurality of holes are opened in a metal plate.

The silicon substrate is treated for 30 minutes by setting the flow rate ratio of hydrogen to nitrogen fluoride to 4, and then the deposits are removed at 1 Torr hydrogen.

Then, the silicon substrate is picked out into the air and then immersed into a pure water. At that time, the native oxide film has been removed from the surface of the wafer positioned below the hole in the capillary plate and the substrate has exhibited hydrophobic.

This means that the present invention may be applied to cleaning of the semiconductor device in the contact hole (native oxide film removal). In actual semiconductor manufacturing steps, various films such as metal film are grown after treatment of the present invention has been conducted.

Subsequently, a cleaning method by use of a hydrogen plasma downstream treatment equipment according to the embodiment of the present invention will be explained hereunder.

In the above hydrogen plasma downstream treatment method, when the chamber 11 made of quartz discharges the NF3 in the treatment equipment shown in FIG. 1, the plasma located in the downstream becomes opaque cloudy in an instant. This is because the inner sidewall of the chamber 11 is etched by fluorine atoms and the deposits generated at the same time stick to the inside of the tube. The inventors of the present invention have plasmanized hydrogen by flowing hydrogen through the opaque chamber 11 and then discharging. At that time, the deposits are removed gradually from the plasma generator 12 towards the downstream, and transparency of the chamber 11 can restored to some degree though the chamber 11 cannot be restored up to its initial transparent state. Hence, it can be understood that cleaning of the inside of the chamber 11 can be implemented by using hydrogen plasma.

This phenomenon occurs similarly if water-vapor-added hydrogen plasma is employed and also transparency of the chamber 11 can be restored quicker than the case only the hydrogens are employed. It seems that this is because transportation of hydrogen atoms towards the downstream of plasma can be carried out with good efficiency in the water-vapor-added hydrogen plasma. Therefore, it is preferable that water-vapor should be added simultaneously in cleaning.

As described above, in the hydrogen plasma downstream treatment equipment and the hydrogen plasma downstream treatment method according to the present invention, the above condition that the flow rate ratio of the hydrogen gas used in the treatment to the nitrogen fluoride gas exceeds 4 is set as the most easily adjustable gas composition condition in place of conventional conditions. Accordingly, the problems such as particles, fluorine residue, etc. can be suppressed to the utmost by causing the hydrogen atoms and the fluorine atoms to react with each other in vapor phase.

What is claimed is:

1. A hydrogen plasma downstream treatment method comprising the steps of:
    plasmanizing a first gas including the hydrogen gas and the nitrogen fluoride gas in a plasma generating region by setting a flow rate of a nitrogen fluoride gas more than four times a flow rate of a hydrogen gas therefore generating a second gas; and
    treating a surface of a semiconductor layer by use of the second gas by placing the semiconductor layer in a region in a downstream of a gas flow of the second gas and separated from the plasma generating region.

2. A hydrogen plasma downstream treatment method according to claim 1, wherein the semiconductor layer is formed of a silicon layer, and surface treatment of the semiconductor layer is treatment for removing an oxide film formed on the surface of the semiconductor layer.

3. A hydrogen plasma downstream treatment method according to claim 1, wherein the semiconductor layer is formed of a silicon layer, and surface treatment of the semiconductor layer is treatment for removing a native oxide film formed on the surface of the semiconductor layer in an opening of an insulating film on the semiconductor layer.

4. A hydrogen plasma downstream treatment method according to claim 1, wherein the second gas is supplied to the semiconductor layer via a chamber,
    the surface of the semiconductor layer is treated by the second gas and then the hydrogen gas is plasmanized in the plasma generating region, and
    the hydrogen gas being plasmanized is supplied to the chamber to clean an inner sidewall of the chamber.

* * * * *